US007991371B2

(12) United States Patent  (10) Patent No.: US 7,991,371 B2
Ishiguro  (45) Date of Patent: Aug. 2, 2011

(54) AUTOMATIC GAIN CONTROL APPARATUS FOR WIRELESS COMMUNICATION APPARATUS

(75) Inventor: Kazuhisa Ishiguro, Gunma (JP)

(73) Assignee: Ricoh Co., Ltd., Tokyo (JP)

( * ) Notice: Subject to any disclaimer, the term of this patent is extended or adjusted under 35 U.S.C. 154(b) by 606 days.

(21) Appl. No.: 11/925,506

(22) Filed: Oct. 26, 2007

(65) Prior Publication Data

US 2008/0090538 A1 Apr. 17, 2008

Related U.S. Application Data

(63) Continuation of application No. PCT/JP2005/022721, filed on Dec. 6, 2005.

(30) Foreign Application Priority Data

Apr. 27, 2005 (JP) .................. 2005-129395

(51) Int. Cl.
H04B 1/16 (2006.01)
(52) U.S. Cl. ..................... 455/234.1; 455/230
(58) Field of Classification Search ............... 455/232.1, 455/234.1, 234.2, 235.1, 236.1, 241.1, 245.1, 455/245.2, 247.1, 249.1, 250.1, 253.2
See application file for complete search history.

(56) References Cited

U.S. PATENT DOCUMENTS

| 6,625,433 | B1* | 9/2003 | Poirier et al. | 455/232.1 |
| 6,718,165 | B1* | 4/2004 | Ha | 455/234.2 |
| 7,227,916 | B2* | 6/2007 | Ruelke et al. | 375/345 |
| 7,313,377 | B2* | 12/2007 | Kansy | 455/250.1 |
| 2005/0266805 | A1* | 12/2005 | Jensen | 455/82 |

FOREIGN PATENT DOCUMENTS

| JP | 09-093509 | 4/1997 |
| JP | 10-256851 | 9/1998 |
| JP | 11-261431 | 9/1999 |

* cited by examiner

*Primary Examiner* — Blane J Jackson
(74) *Attorney, Agent, or Firm* — Connolly Bove Lodge & Hutz LLP

(57) ABSTRACT

An arbitrary threshold value (Ei0) is established which defines a boundary as to activating an RF-AGC circuit (21) if the value of the field intensity (Ei) of a received signal is greater than what value while the value of the field intensity of a signal at a desired frequency being a predetermined value (Ei0) in a weak field area. The established value (Ei0) is used to provide a threshold value establishing/controlling part (22) that controls the ON/OFF of the operation of the RF-AGC circuit (21). In this way, a set maker or the like of an IC including an automatic gain control part (11) can perform a field test or the like such that a preferable value obtained by a result of the field test or the like can be used as an AGC start level (Ei0), whereby an optimum AGC control can be performed based on the preferable AGC start level (Ei0).

10 Claims, 6 Drawing Sheets

| AGC START LEVEL [dBμ] | ID VALUE |
|---|---|
| 100 | 0000 |
| 90 | 0001 |
| 80 | 0010 |
| 70 | 0011 |
| 60 | 0100 |

Fig. 6

| WEAK FIELD START LEVEL [dBμ] | AGC START LEVEL [dBμ] | ID VALUE |
|---|---|---|
| Et1 | 100 | 00000001 |
| Et1 | 90 | 00000010 |
| Et1 | 80 | 00000011 |
| Et1 | 70 | 00000100 |
| Et1 | 60 | 00000101 |
| Et2 | 100 | 00000110 |
| Et2 | 90 | 00000111 |
| Et2 | 80 | 00001000 |
| Et2 | 70 | 00001001 |
| Et2 | 60 | 00001010 |
| Et3 | 100 | 00001011 |
| Et3 | 90 | 00001100 |
| Et3 | 80 | 00001101 |
| Et3 | 70 | 00001110 |
| Et3 | 60 | 00001111 |
| Et4 | 100 | 00010000 |
| Et4 | 90 | 00010001 |
| Et4 | 80 | 00010010 |
| Et4 | 70 | 00010011 |
| Et4 | 60 | 00010100 |

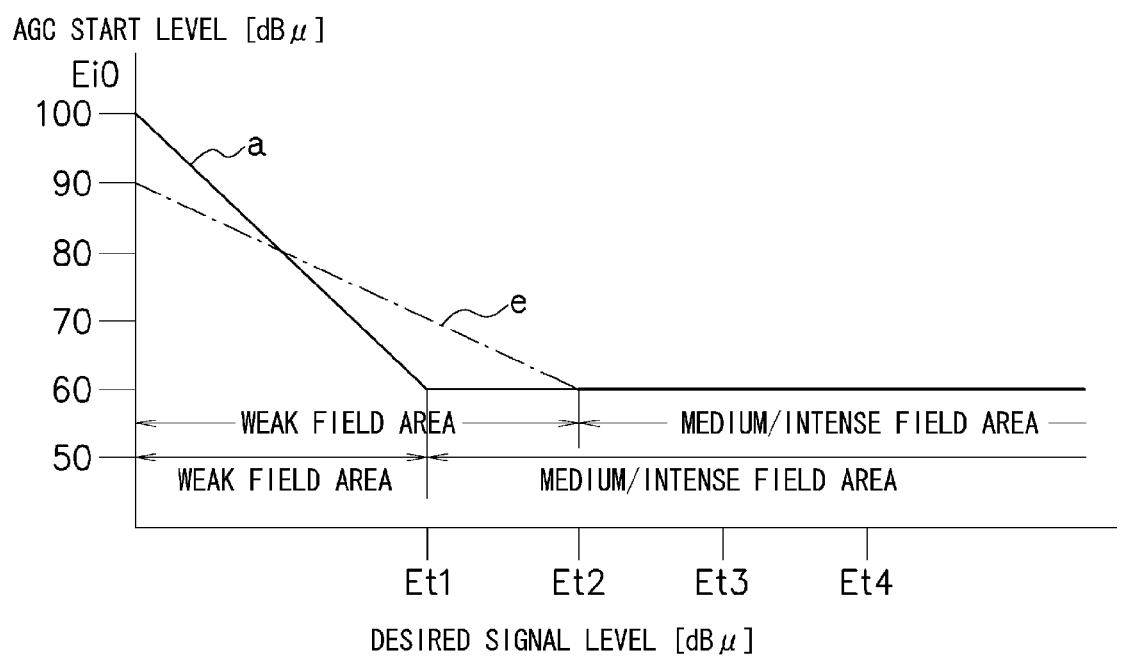

AUTOMATIC GAIN CONTROL APPARATUS FOR WIRELESS COMMUNICATION APPARATUS

RELATED APPLICATIONS

This application is a continuation application of PCT/JP2005/022721 filed Dec. 6, 2006, which in turn claims benefit of Japanese application 2005-129395 filed Apr. 27, 2005, entire disclosures of which are incorporated herein by reference.

FIELD OF THE INVENTION

The present invention relates to an automatic gain control apparatus, and particularly to an apparatus that performs an AGC operation for suppressing the distortion when a strong signal is inputted to a wireless communication apparatus, such as a radio receiver.

BACKGROUND OF THE INVENTION

In general, a wireless communication apparatus, such as a radio receiver, has an AGC (Automatic Gain Control) circuit for adjusting the gain of a received signal. The RF (Radio Frequency) AGC circuit is designed to adjust the gain of an RF signal received by an antenna to keep the received signal at a constant level. The RF-AGC circuit will not be activated when the electric field intensity of the signal inputted to the antenna is smaller than or equal to a threshold value and hence will not reduce the gain of the received signal. However, when a signal having an intense field greater than the threshold value is inputted to the antenna, the RF-AGC circuit is activated to reduce the gain of the received signal (see the patent documents 1 and 2, for example).

Patent Document 1: Japanese Patent Laid-Open No. 6-276116
Patent Document 2: Japanese Patent Laid-Open No. 2004-48177

Such an AGC circuit is effective in reducing the level of interference waves contained in the received signal. For example, when a strong interference wave is inputted (and hence the received field intensity exceeds the threshold value), reducing the gain of the RF signal can reduce the signal level of the interference wave. However, the RF signal, the gain of which is to be reduced, contains a signal at a desired frequency as well as the interference wave noise signal. Therefore, activation of the RF-AGC circuit disadvantageously reduces the level of the signal at the desired frequency at the same time.

Thus, for example, when the received field intensity exceeds the threshold value as a result of reception of the strong interference wave even though the level of the signal at the desired frequency is small, the AGC circuit reduces the gain of the RF signal, resulting in further reduction of the level of the signal at the desired frequency, which is small in the first place. Reception sensitivity for the desired channel is therefore significantly reduced, resulting in a disadvantage of almost inaudible audio of interest.

To avoid such inconvenience, there has been proposed a technology in which the field intensity at a desired frequency is detected, and the AGC sensitivity is reduced when the detected field intensity is smaller than a threshold value, so that the AGC operation is not activated when the field intensity at the desired channel is weak (see the non-patent document 1, for example).

Non-patent Document 1: Development of High-performance FM Front End IC with improved interference characteristic; IEEE Transactions on Consumer Electronics, Vol. 37, No. 3, AUGUST 1991 by Sanyo Electric Co., Ltd.

FIG. 1 shows the characteristics of an AGC operation achieved by the technology described in the non-patent document 1. As shown in FIG. 1, according to the non-patent document 1, in a medium/intense field area where the detected voltage Vcont corresponding to the field intensity at a desired frequency is greater than or equal to 2 [V], the AGC operation is turned on when the field intensity of the signal inputted to the antenna exceeds 60 [dBμ]. On the other hand, in a weak field area where the detected voltage Vcont is smaller than 2 [V], the threshold value at which the AGC operation is turned on is increased to 85 [dBμ], so that the AGC operation will not immediately be turned on even if the field intensity of the signal inputted to the antenna exceeds 60 [dBμ].

In the technology described in the non-patent document 1, however, the operation described above is achieved with an IC having an analog circuit configuration. The threshold value that defines the boundary between the medium/intense field area and the weak field area (hereinafter referred to as "weak field start level") is a fixed value, and this value cannot be changed once the IC has been designed. The threshold value that defines the boundary at which it is judged whether or not the AGC operation is activated in the weak field area (hereinafter referred to as "AGC start level") is also a fixed value, and this value cannot be changed once the IC has been designed.

In general, designers of ICs including AGC circuits do not know what products the ICs are applied to or what situations the ICs are used in. It is therefore difficult for the designers to determine a optimum value of the weak field start level and the AGC start level. In fact, conditions including reception of desired waves and the way interference waves are received are totally different depending on the usage of the IC, that is, whether the IC is used in a radio receiver, in a mobile phone, or in other wireless communication apparatuses. Even when the IC is used in products of the same category, for example, radio receivers, the reception of desired waves and interference waves is totally different depending on whether the IC is incorporated in a home-use audio apparatus or a car radio receiver. Thus, every product in which an IC including an AGC circuit is used has its own weak field start level and AGC start level required to perform optimum RF-AGC control without compromising reception sensitivity of a desired wave in a weak field area.

That is, it is desired in the first place that a manufacturer or the like of a product in which an IC is incorporated carries out a field test or the like and resultant optimum values are used as the weak field start level and the AGC start level. As described above, however, in the technology described in the non-patent document 1, the weak field start level and the AGC start level are fixed values, so that they cannot be customized. Optimum RF-AGC control without compromising reception sensitivity of desired waves in a weak field area is therefore practically not possible.

DISCLOSURE OF THE INVENTION

The present invention has been made to solve the above problems and aims to provide an ability to perform optimum RF-AGC control without compromising reception sensitivity of desired waves in a weak field area.

To solve the above problems, the automatic gain control apparatus of the present invention is designed to arbitrarily set a second threshold value that defines a boundary of the field intensity of the received signal, at or above which the gain controller is activated, when the field intensity of a signal at a desired frequency contained in the received signal is a predetermined value in a weak field area, and the thus set value is used to perform ON/OFF operations of the gain controller. In another aspect of the present invention, a first threshold value is arbitrarily set as well as the second threshold value. The first threshold value defines the boundary that establishes the weak field area where the field intensity of the signal at the desired frequency contained in the received signal is smaller than or equal to the first threshold value, and the thus set value is used to perform the ON/OFF operations of the gain controller.

According to the above configuration of the present invention, for example, a manufacturer or the like of a product in which an IC containing the automatic gain control apparatus of the present invention is incorporated can carry out a field test or the like and set resultant optimum values as the first threshold value (weak field start level) and the second threshold value (AGC start level). In this way, optimum AGC control can be performed without compromising reception sensitivity at the desired frequency in the weak field area.

BRIEF DESCRIPTION OF THE DRAWINGS

FIG. 6 shows another example of the table information stored in the weak field AGC table storage according to the present embodiment; and FIG. 7 is a characteristic diagram showing another example of the AGC control achieved by the automatic gain controller according to the present embodiment.

DETAILED DESCRIPTION OF THE PREFERRED EMBODIMENTS

Figure 1:
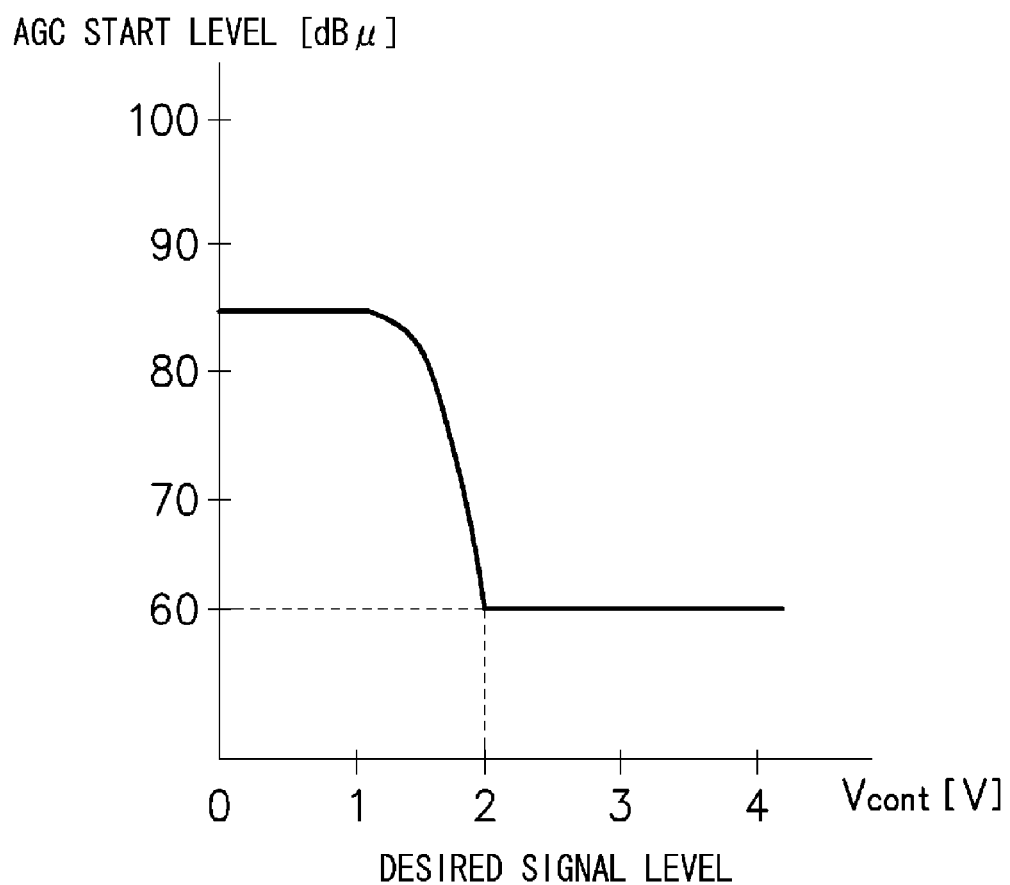
FIG. 1 shows the characteristics of an AGC operation achieved by prior art.
Figure 2:
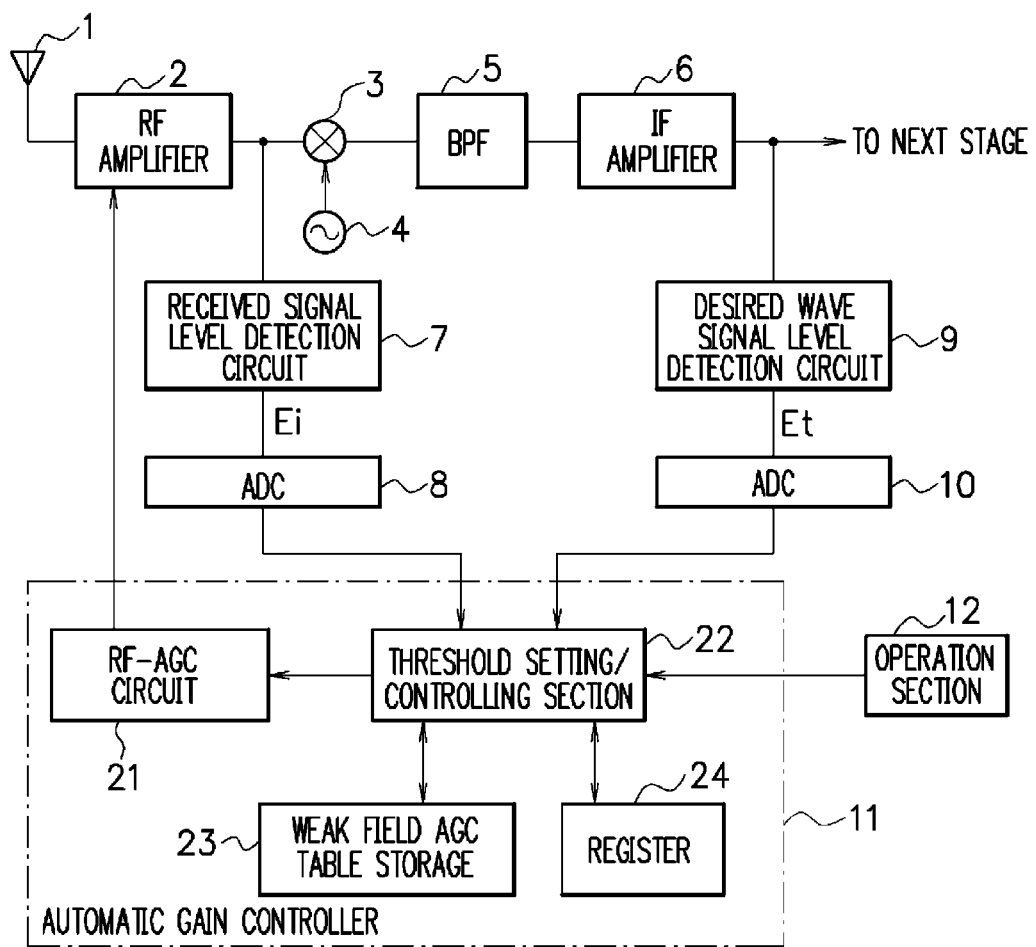
FIG. 2 is a block diagram showing an exemplary configuration of the main portion of a radio receiver in which the automatic gain control apparatus of the present invention is embodied.
Figures 3, 4:
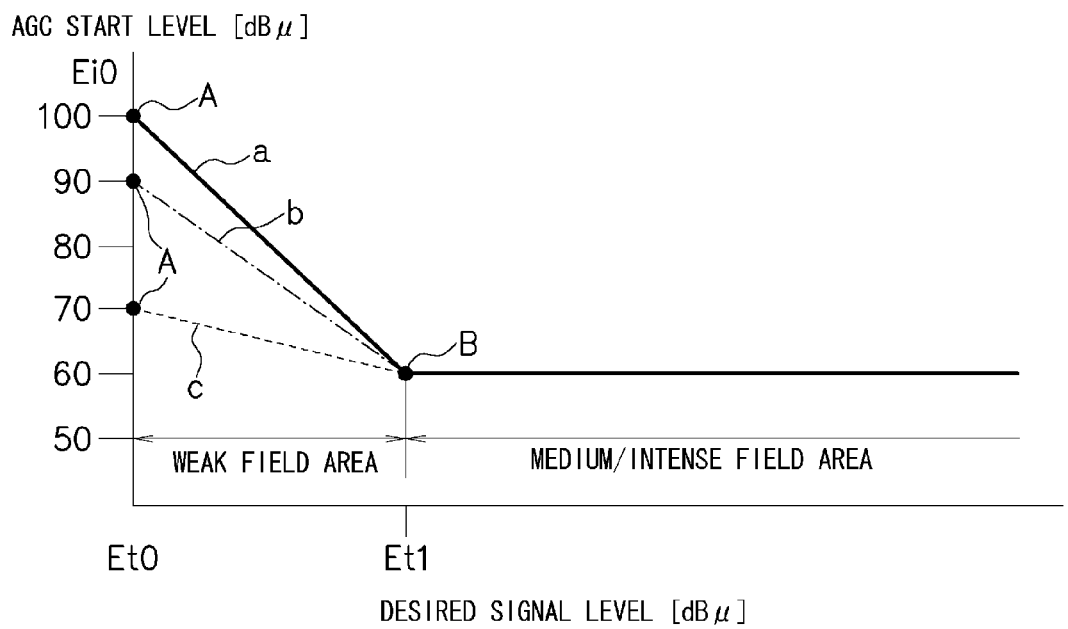
FIG. 3 is a characteristic diagram showing an example of AGC control achieved by the automatic gain controller according to the present embodiment.
FIG. 4 shows an example of table information stored in a weak field AGC table storage according to the present embodiment.

An embodiment of the present invention will be described below with reference to the drawings. FIG. 2 is a block diagram showing an exemplary configuration of the main portion of a radio receiver in which the automatic gain control apparatus of the present invention is embodied. FIG. 3 is a characteristic diagram showing an example of AGC control achieved by the automatic gain controller 11 according to the present embodiment.

In FIG. 2, reference numeral 1 denotes an antenna that receives signals of radio broadcasting waves. Reference numeral 2 denotes a radio frequency amplifier circuit (RF amplifier) that amplifies the radio frequency signals of the broadcasting waves received by the antenna 1 (received signals). The amplification gain is determined by the automatic gain controller 11 (which will be described later) according to the present embodiment.

Reference numerals 3 and 4 denote a mixing circuit (mixer) and a local oscillator circuit, respectively, which form a frequency converter. The frequency converter mixes the radio frequency signal outputted from the RF amplifier 2 and the local oscillating signal outputted from the local oscillator circuit 4 in the mixer 3, and performs frequency conversion to produce and output an intermediate frequency signal. Reference numeral 5 denotes a band-pass filter (BPF) in which the band of the intermediate frequency signal outputted from the mixer 3 is limited to a certain range so that an intermediate frequency signal at a desired reception frequency band is produced.

Reference numeral 6 denotes an intermediate frequency amplifier circuit (IF amplifier) that amplifies the intermediate frequency signal (signal at a desired frequency) outputted from the BPF 5. Reference numeral 7 denotes a received signal level detection circuit that detects the radio frequency amplified signal outputted from the RF amplifier 2 and obtains the field intensity Ei of the received signal (which contains an interference wave signal as well as the signal at the desired frequency). Reference numeral 8 denotes an A/D converter circuit that converts the analog value of the field intensity Ei detected by the received signal level detection circuit 7 into digital data.

Reference numeral 9 denotes a desired wave signal detection circuit that detects the intermediate frequency amplified signal outputted from the IF amplifier 6 and obtains the field intensity Et of the signal at the desired frequency. Reference numeral 10 denotes an A/D converter circuit that converts the analog value of the field intensity Et detected by the desired wave signal detection circuit 9 into digital data. The detected field intensity values Ei and Et, which are digital data converted in the A/D converter circuits 8 and 10, are inputted to the automatic gain controller 11 according to the present embodiment.

The automatic gain controller 11 according to the present embodiment includes an RF-AGC circuit 21, a threshold setting/controlling section 22, a weak field AGC table storage 23, and a register 24. The RF-AGC circuit 21 adjusts the amplification rate of the received signal in the RF amplifier 2 so as to control the gain applied to the received signal. The RF-AGC circuit 21 corresponds to the gain controller of the present invention.

The RF-AGC circuit 21 will not be activated when the field intensity Ei of the received signal is smaller than or equal to a threshold value and hence will not reduce the level of the received signal. On the other hand, when the field intensity Ei of the received signal is greater than the threshold value, the RF-AGC circuit 21 will be activated to reduce the level of the interference wave signal and prevent an excessive power from being applied to the radio receiver. The threshold value will now be described with reference to FIG. 3.

In FIG. 3, the vertical axis represents the field intensity Ei [dBμ] of the received signal detected by the received signal level detection circuit 7, and the horizontal axis represents the field intensity Et [dBμ] of the signal at a desired frequency detected by the desired wave signal detection circuit 9. As shown in FIG. 3, a weak field area is the area where the field intensity Et of the signal at the desired frequency is smaller than or equal to a first threshold value (weak field start level) Et1, and a medium/intense field area is the area where the field intensity Et is greater than the first threshold value Et1. In the present embodiment, the weak field start level Et1 is a fixed value.

In the medium/intense field area, when the field intensity Ei of the received signal is smaller than 60 [dBμ] (corresponding to a second predetermined value according to the present invention), the RF-AGC circuit 21 will not be activated and hence will not reduce the level of the received signal. On the other hand, when the field intensity Ei of the received signal is greater than 60 [dBµ], the RF-AGC circuit 21 will be activated and reduces the level of the received signal. In the present embodiment, the second predetermined value is also a fixed value, but the value of 60 [dBµ] is presented only by way of example.

As described above, in the medium/intense field area, the threshold value (AGC start level) that defines the boundary at which the RF-AGC circuit 21 is activated when the field intensity Ei of the received signal is greater than or equal to a value determined by the threshold value is a value fixed to the second predetermined value. On the other hand, the AGC start level in the weak field area can be arbitrarily set by a user. To this end, the automatic gain controller 11 according to the present embodiment includes the threshold value setting/controlling section 22, the weak field AGC table storage 23, and the register 24.

The weak field AGC table storage 23 stores values that the user can arbitrarily set as the AGC start level Ei0 (corresponding to a second threshold value according to the present invention) that defines the boundary of the field intensity Ei of the received signal, at or above which the RF-AGC circuit 21 is activated, when the field intensity Et of the signal at the desired frequency is a first predetermined value Et0 in the weak field area, with each value in the table stored as the table information corresponding to an identifiable value that can be uniquely identified.

FIG. 4 shows an example of the table information stored in the weak field AGC table storage 23. According to the example shown in FIG. 4, the user can arbitrarily select and set any one of the following five values: 60 [dBµ], 70 [dBµ], 80 [dBµ], 90 [dBµ], and 100 [dBµ] as the value of the AGC start level Ei0 when the field intensity Et of the signal at the desired frequency has the first predetermined value Et0. The values listed above are presented only by way of example.

The register 24 holds the setting information on the AGC start level Ei0 and corresponds to the threshold value information holding means of the present invention. Specifically, the register 24 holds the identifiable value of the AGC start level Ei0 that has been set. The threshold value setting/controlling section 22 sets the AGC start level Ei0 and stores the identifiable value of the AGC start level Ei0 that has been set in the register 24. The threshold value setting/controlling section 22 corresponds to the threshold value setting means of the present invention. The threshold value setting/controlling section 22 can be formed of, for example, a DSP (Digital Signal Processor) or a CPU.

Setting the AGC start level Ei0 is carried out based on an instruction from the user via an operation section 12. For example, the operation section 12 is formed of dip switches or the like and is configured in such a way that the user can arbitrarily switch the switches to select the value of the AGC start level Ei0 from the five values. The threshold value setting/controlling section 22 sets the identifiable value indicative of the value of the selected AGC start level Ei0 in the register 24 based on a signal indicative of selected switches provided from the operation section 12.

Although dip switches are herein presented as an example of the operation section 12, they are presented only by way of example. The operation section 12 is not limited to dip switches, but may be any other means as long as it can arbitrarily select the value of the AGC start level Ei0 through the user operation.

The threshold value setting/controlling section 22 also forms the control means of the present invention. That is, the threshold value setting/controlling section 22 controls whether or not the RF-AGC circuit 21 is activated based on the weak field start level Et1 held as a fixed value in advance, the AGC start level Ei0 obtained by using the identifiable value held in the register 24 to refer to the weak field AGC table storage 23, and the field intensity Ei of the received signal and the field intensity Et of the signal at the desired frequency that are actually detected (digital data of the field intensity values Ei and Et outputted from the A/D converter circuits 8 and 10).

Specifically, the threshold value setting/controlling section 22 identifies a threshold value for the field intensity of the received signal corresponding to the field intensity Et of the desired frequency signal outputted from the A/D converter circuit 10 according to the function determined by two points: the AGC start level Ei0 of the received signal (the value of the point A shown in FIG. 3) when the field intensity Et of the desired frequency signal is the first predetermined value Et0 and the second predetermined value of the received signal (the value of the point B shown in FIG. 3) when the field intensity Et of the desired frequency signal is the weak field start level Et1. Then, the identified threshold value is compared with the field intensity Ei of the received signal outputted from the A/D converter circuit 8. When the field intensity Ei of the received signal is greater than or equal to the identified threshold value, the threshold value setting/controlling section 22 activates the RF-AGC circuit 21.

The function determined by the points A and B is, for example, a linear function. In this case, the AGC start level in the weak field area (the threshold value for the field intensity of the received signal corresponding to the field intensity Et of the desired frequency signal outputted from the A/D converter circuit 10) lies on the straight line "a", "b" or "c" shown in FIG. 3. The straight line "a" represents the AGC start levels in the weak field area when the AGC start level Ei0 is set to 100 [dBµ], while the straight lines "b" and "c" represent the AGC start levels in the weak field area when the AGC start levels Ei0 are set to 90 and 70 [dBµ], respectively.

For example, when the AGC start level Ei0 is set to 100 [dBµ], if the field intensity Et of the desired frequency signal actually detected has the exact median value between Et0 and Et1 (=Et0+(Et1−Et0)/2), the AGC start level, which is the threshold value to be compared with the field intensity Ei of the received signal actually detected, is 80 [dBµ] (=60+(100−60)/2). That is, if the field intensity Et of the desired frequency signal outputted from the A/D converter circuit 10 is Et0+(Et1−Et0)/2, the threshold value setting/controlling section 22 activates the RF-AGC circuit 21 when the field intensity Ei of the received signal outputted from the A/D converter circuit 8 is greater than or equal to 80 [dBµ].

As described above in detail, in the present embodiment, since the user can arbitrarily set the AGC start level Ei0 in the weak field area, for example, a manufacturer or the like of a product in which an IC including the automatic gain controller 11 is incorporated according to the present embodiment can carry out a field test or the like and set a resultant preferred value as the AGC start level Ei0. In this way, independent of products to which the automatic gain controller 11 according to the present embodiment is applied, appropriate RF-AGC control can be performed without compromising reception sensitivity at a desired frequency in the weak field area.

Additionally, in the present embodiment, the field intensity Ei of the received signal and the field intensity Et of the signal at a desired frequency are converted into digital data and the ON/OFF operations of the RF-AGC circuit 21 are controlled as digital signal processing. This also advantageously provides the ability to set the AGC start level according to a linear function, for example, that shown in FIG. 3, in the weak field area.

Although in the above embodiment, the description has been made of the case where a linear function determined by the points A and B in FIG. 3 is used to set the AGC start level in the weak field area, the function to be used for this purpose is not limited thereto. For example, a quadratic function or any other function determined by the points A and B in FIG. 3 may be used to set the AGC start level in the weak field area.

Although in the above embodiment, the description has been made of the case where the AGC start level in the weak field area is identified according to a predetermined function, the way to identify the AGC start level in the weak field area is not limited thereto. For example, the AGC start level Ei0 set in the register 24 may be used as the AGC start level in the entire weak field area. Even when the AGC start level is set to the same value Ei0 across the weak field area, the AGC start level Ei0 itself can be arbitrarily set, thus providing an increased degree of freedom compared with that conventionally achieved.

More preferably, however, by identifying the AGC start level in the weak field area according to a predetermined function, the AGC start level in the weak field area can be set in a detailed manner according to the field intensity Et of the signal at a desired frequency. In the weak field area, since the value of the field intensity Et of the signal at a desired frequency it self is small, reduction in the level of the received signal more than necessary in the RF-AGC circuit 21 can significantly reduce reception sensitivity at the desired frequency. The smaller the field intensity Et of the signal at a desired frequency, the more this is true. Use of a predetermined function to increase the AGC start level as the field intensity Et of the signal at a desired frequency decreases therefore allows more appropriate RF-AGC control.

Figure 5:
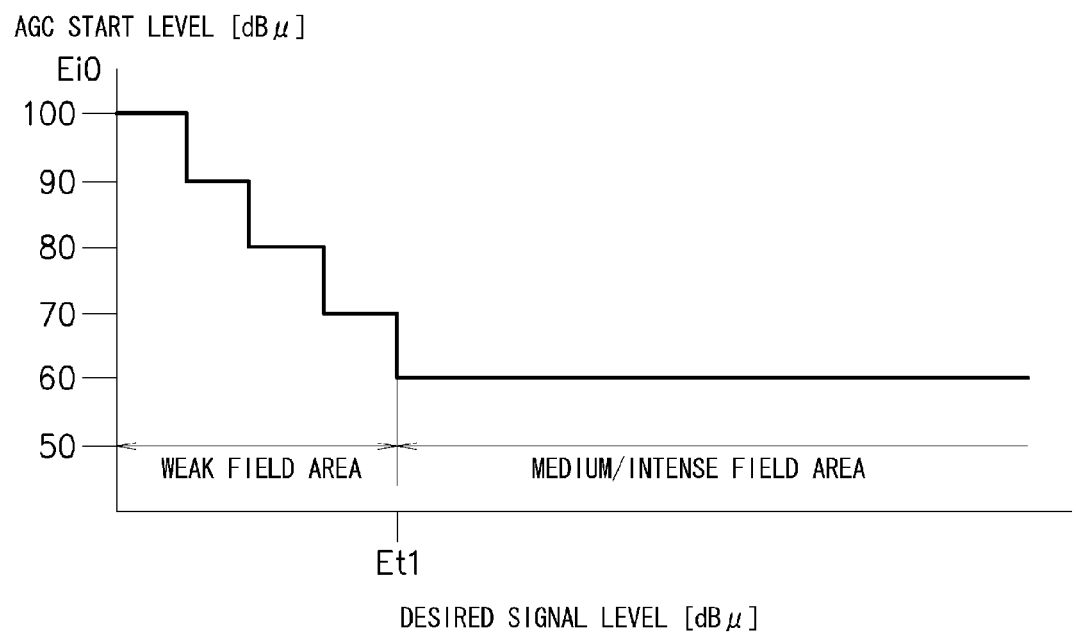
FIG. 5 is a characteristic diagram showing another example of the AGC control achieved by the automatic gain controller according to the present embodiment.

In the above embodiment, although the description has been made of the case where the user sets the AGC start level Ei0 only at one point, the point A in the weak field area, the present invention is not limited thereto. For example, the user may arbitrarily set AGC start levels at a plurality of discrete points in the weak field area. In this case, the AGC start level between any adjacent pair of the set AGC start levels may be set using a predetermined function or may be a fixed value without using any function (in the latter case, the AGC start levels in the weak field area change stepwise as shown in FIG. 5).

In the above embodiment, the weak field start level is a predetermined fixed value Et1, but may also be arbitrarily set by the user. That is, the threshold setting/controlling section 22 arbitrarily sets the weak field start level as well as the AGC start level Ei0 and holds the identifiable value in the register 24. In this configuration, the table information stored in the weak field AGC table storage 23 is, for example, those shown in FIG. 6.

When the weak field start level can also be thus arbitrarily set, the AGC start levels in the entire weak field area lie, for example, on the straight lines "a" and "e" shown in FIG. 7. The straight line "a" is the same straight line "a" shown in FIG. 3 and shows AGC start levels in the weak field area when the AGC start level Ei0 is set to 100 [dBμ] and the weak field start level is set to Et1. The straight line "e" shows AGC start levels in the weak field area when the AGC start level Ei0 is set to 90 [dBμ] and the weak field start level is set to Et2. By thus allowing the user to set the weak field start level as well as the AGC start level Ei0, the AGC start level in the weak field area can be set in a more detailed manner, providing more appropriate RF-AGC control.

In the above embodiment, although the description has been made of the case where the field intensity is compared in the [dBμ] unit, the invention is not limited thereto. For example, a voltage value corresponding to the field intensity may be detected and the field intensity may be compared in the [V] unit.

In the above embodiment, although the description has been made of the case where the automatic gain controller 11 according to the present embodiment is implemented in a radio receiver, the product in which the automatic gain controller 11 is implemented is not limited to a radio receiver.

The above embodiments are presented only by way of specific example of implementing the present invention, and the technical range of the present invention should not therefore be construed in a limiting sense. That is, the present invention can be implemented in a variety of ways without departing from the spirit or the key features thereof.

INDUSTRIAL APPLICABILITY

The automatic gain control apparatus of the present invention is useful in a wireless communication apparatus that receives and processes radio frequency signals.

The invention claimed is:

1. An automatic gain control apparatus, comprising:
   a gain controller configured to control a gain of a received signal, wherein the gain controller includes:
      a threshold value setting/controlling unit configured to enable a user to set at least one threshold value;
      at least one register coupled to the threshold value setting/controlling unit and configured to hold setting information corresponding to the at least one threshold value; and
      a control unit configured to control the gain controller based at least in part on detected values corresponding to field intensities of the received signal and a desired frequency signal,
   wherein the threshold value setting/controlling unit is configured to enable the user to set at least one user-set gain value for controlling the gain of the received signal in a weak field region of the desired frequency signal; and
   wherein the control unit is further configured to control a gain value of the gain controller used to control the gain of the received signal based at least in part on whether the detected value corresponding to the field intensity of the desired frequency signal falls in the weak field region or a medium/intense field region.

2. The automatic gain control apparatus according to claim 1, wherein the threshold value setting/controlling unit is further configured to enable the user to set a first threshold value to define a boundary between the weak field region and the medium/intense field region.

3. The automatic gain control apparatus according to claim 2, wherein the threshold value setting/controlling unit is further configured to enable the user to set one or more additional threshold values to define sub-regions within the weak field region.

4. The automatic gain control apparatus according to claim 3, wherein the threshold value setting/controlling unit is further configured to enable the user to set one or more additional user-set gain values associated with one or more of the additional threshold values.

5. The automatic gain control apparatus according to claim 1, wherein
   the control unit is further configured to control the gain value of the gain controller used to control the gain of the received signal based on a function determined by at least two points corresponding, respectively, to a minimum field intensity of the weak field region and a maximum field intensity of the weak field region, wherein the gain value of the gain controller used to control the gain of the received signal at the minimum field intensity of the weak field region corresponds to the user-set gain value, and wherein the gain value of the gain controller used to control the gain of the received signal at the maximum field intensity of the weak field region corresponds to a predetermined gain value.

6. The automatic gain control apparatus according to claim 5, wherein the function is constant within the weak field region.

7. The automatic gain control apparatus according to claim 5, wherein the function corresponds to a linear function connecting the two points.

8. The automatic gain control apparatus according to claim 5, wherein the function corresponds to a quadratic function connecting the two points.

9. The automatic gain control apparatus according to claim 1, wherein the gain controller is activated when the field intensity of the received signal is at or above a second threshold value defining a minimum field intensity of the weak field region.

10. The automatic gain control apparatus according to claim 1, wherein the user-set gain value corresponds to a gain value at a second threshold value delineating a minimum field intensity corresponding to the weak field region, and wherein the first threshold value delineates a boundary between the weak-field region and the medium/intense field region.

* * * * *